United States Patent
Lin et al.

(10) Patent No.: US 7,012,014 B2
(45) Date of Patent: Mar. 14, 2006

(54) RECESSED GATE STRUCTURE WITH REDUCED CURRENT LEAKAGE AND OVERLAP CAPACITANCE

(75) Inventors: Da-Wen Lin, Taiping (TW); Yi-Ming Sheu, Hsinchu (TW); Ying-Keung Leung, Aberdeen (HK)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 46 days.

(21) Appl. No.: 10/728,967

(22) Filed: Dec. 4, 2003

(65) Prior Publication Data

US 2005/0127433 A1    Jun. 16, 2005

(51) Int. Cl.
  *H01L 21/3205* (2006.01)
(52) U.S. Cl. .................. 438/589; 438/230; 438/303; 438/591; 438/595
(58) Field of Classification Search .............. 438/589, 438/585, 586, 591, 592, 595, 229, 230, 299, 438/301, 303, 305
See application file for complete search history.

(56) References Cited

U.S. PATENT DOCUMENTS

| | | | | |
|---|---|---|---|---|
| 6,165,826 A * | 12/2000 | Chau et al. | .................. | 438/586 |
| 6,171,916 B1 * | 1/2001 | Sugawara et al. | .......... | 438/582 |
| 6,358,800 B1 * | 3/2002 | Tseng | ......................... | 438/589 |
| 6,423,618 B1 * | 7/2002 | Lin et al. | .................... | 438/589 |

* cited by examiner

*Primary Examiner*—Kevin M. Picardat
(74) *Attorney, Agent, or Firm*—Tung & Assoc.

(57) ABSTRACT

A gate structure and method for forming the same the method including providing a silicon substrate including one of N and P-well doped regions and an overlying the CVD silicon oxide layer; forming an opening in the CVD silicon oxide layer to include a recessed area extending into a thickness portion of the silicon substrate; thermally growing a gate oxide over exposed silicon substrate portions of the recessed area; backfilling the opening with polysilicon; planarizing the polysilicon to the opening level to reveal the silicon oxide layer; and, selectively removing the silicon oxide layer to form a recessed gate structure.

26 Claims, 4 Drawing Sheets

RECESSED GATE STRUCTURE WITH REDUCED CURRENT LEAKAGE AND OVERLAP CAPACITANCE

FIELD OF THE INVENTION

This invention generally relates to MOSFET semiconductor devices and methods for forming the same and more particularly to a MOSFET device and method for forming the same having a shallow S/D junction depth with reduced drain to gate overlap capacitance and reduced current (diode) leakage characteristics for deep-submicron (<0.25 micron) MOSFET semiconductor devices.

BACKGROUND OF THE INVENTION

In the integrated circuit industry today, hundreds of thousands of semiconductor devices are built on a single chip. As the size of CMOS transistors, also referred to as MOSFETs, are scaled down, one of the most important challenges facing a device designer are short channel effects (SCE) in reduced gate length devices. For example, short channel effects that influence the electrical operating characteristics of CMOS devices include $V_T$ rolloff, drain induced barrier lowering (DIBL), and subthreshold swing degradation. Short channel effects (SCE) are a function of several processing effects including width and depth of S/D regions and S/D region dopant concentration.

For example, since a characteristic $V_T$ rolloff length is related to the junction depth (xj), shallower junction (S/D region) depths can improve device operating characteristics. However, an off-setting consideration is the increase in the S/D parasitic resistance which has several components including the resistance of the source/drain extension (SDE) region and the resistance of salicide portions over the source/drain regions. As the junction depth decreases to reduce SCE, S/D parasitic resistances may increase thereby degrading device performance.

To overcome some of the short channel effects (SCE) effects as device sizes are scaled down, including leakage current (diode leakage), proposed solutions have included providing raised S/D regions by raising up the S/D contact surface by selective epitaxial silicon growth (SEG) over the S/D contact regions. While diode leakage has been shown to be reduced by this process, other shortcomings remain, including achieving shallower junction depths while preserving a low S/D resistance and reducing overlap capacitance between the S/D regions and the channel region underlying the gate structure. For example, Gate to drain overlap capacitance has important implications in both analog and digital applications including high frequency applications. Gate to drain overlap capacitance is strongly affected by lateral diffusion of the doped S/D regions, which is increasingly difficult to control by thermal processes. For example, carrying out a process to form raised S/D structures following doping of the S/D regions contributes an additional thermal process which can undesirably increase the lateral diffusion thereby increasing gate to drain overlap capacitance and degrading device performance.

There is therefore a continuing need in the MOSFET device design and processing art to develop new device designs and processing methods for forming MOSFET devices to achieved reduced short channel effects (SCE) while avoiding degradation of device performance including overlap capacitance.

It is therefore among the objects of the present invention to provide an improved MOSFET device and a process for forming the same to achieved reduced short channel effects (SCE) while avoiding degradation of device performance including overlap capacitance in addition to overcoming other shortcomings of the prior art.

SUMMARY OF THE INVENTION

To achieve the foregoing and other objects, and in accordance with the purposes of the present invention, as embodied and broadly described herein, the present invention provides a gate structure and method for forming the same to reduce current leakage and overlap capacitance.

In a first embodiment, the method includes providing a silicon substrate including one of N and P-well doped regions and an overlying the CVD silicon oxide layer; forming an opening in the CVD silicon oxide layer to include a recessed area extending into a thickness portion of the silicon substrate; thermally growing a gate oxide over exposed silicon substrate portions of the recessed area; backfilling the opening with polysilicon; planarizing the polysilicon to the opening level to reveal the silicon oxide layer; and, selectively removing the silicon oxide layer to form a recessed gate structure.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to exemplary processing steps for forming a sub-quarter micron technology MOSFET device. It will be appreciated that the method may be used with larger device technologies, but that it is most advantageously used with sub-quarter micron design rule technologies (e.g., <0.25 microns), including less than about 0.1 micron (nanometer) design rule technology. It will further be appreciated that although the method of the present invention is most advantageously used and an exemplary implementation detailed with respect to exemplary reduced S/D doping implant depths which is an advantage of the MOSFET device and method for forming the same, that the S/D depth may be varied depending on e design rules and doping methods.

Figure 1A:
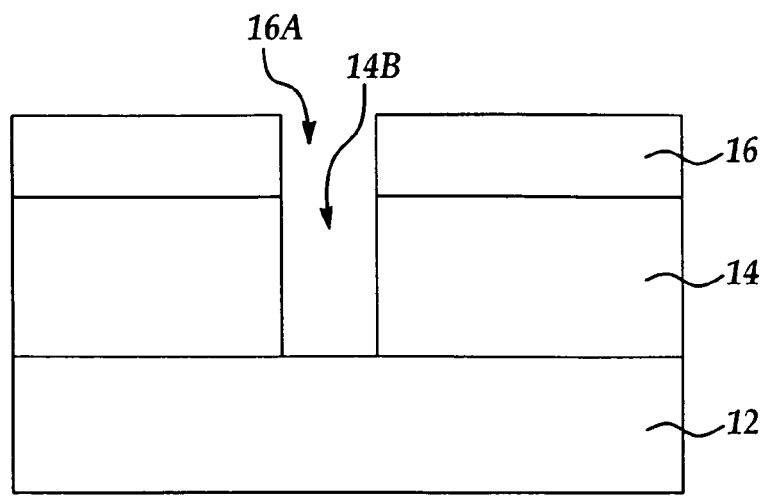
FIGS. 1A–1I are cross sectional schematic representations of a portion of a CMOS transistor showing stages in manufacture according to an embodiment of the present invention.

In an exemplary embodiment of the present invention, reference is made to FIGS. 1A–1I where cross sectional schematic views are shown of an exemplary MOSFET CMOS transistor in stages of manufacture according to embodiments of the present invention. For example, referring to FIG. 1A, is shown a conventional silicon semiconductor substrate 12, for example including conventionally formed layers of doping (not shown) including buried layers e.g., a $P^+$ doped silicon lower portion, a $P^+$ buried layer over the P doped silicon, and an optional $P^-$ epi layer over the P+ buried layer. It will be appreciated that the substrate may include STI features (not shown) previously formed therein according to conventional methods including forming an N or P-well doped regions formed in upper portion of the substrate 12 by conventional ion implantation methods.

Still referring to FIG. 1A, a thick oxide layer (e.g., $SiO_2$ field oxide) 14 is deposited by conventional methods, for example HDP-CVD or PECVD methods to a depth of about a desired thickness of a subsequently formed gate structure, for example from about 3000 Angstroms to about 6000 Angstroms.

Still referring to FIG. 1A, one or more resist layers, e.g., 16 is deposited and lithographically patterned to form an etching mask opening e.g., 16A for carrying out a conventional oxide plasma assisted etch process, e.g., a reactive ion etch (RIE process. The silicon oxide layer 14 is then etched through a thickness to expose the underlying silicon substrate 12 to form an opening e.g., 14B.

Figure 1B:
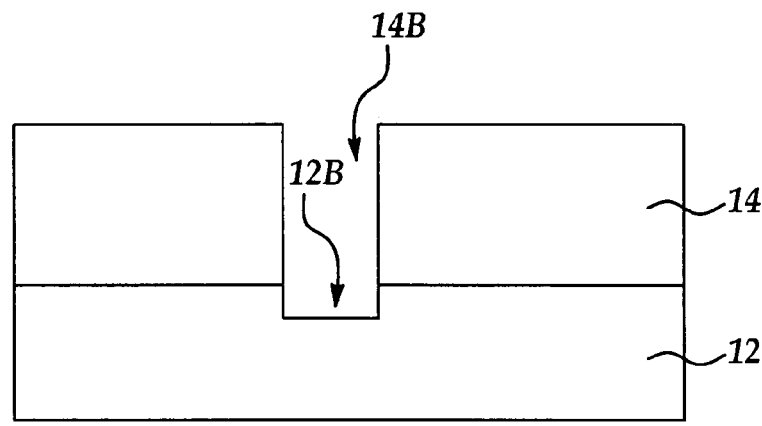

Referring to FIG. 1B, in an important aspect of the present invention, following removal of the resist layer 16, for example by an oxygen ashing and/or a wet stripping process, a conventional silicon dry (plasma assisted) etch process is carried out to etch through a thickness portion of the silicon substrate 12 to form a recessed opening area e.g., 12B using the silicon oxide opening e.g., 14B as an etching mask. It will be appreciated that the depth of the recessed opening area 12B is adjustable depending on MOSFET design rules, and depending on the depth of a subsequently formed S/D extension (SDE) implant depth. For example, preferably, the recessed opening 12B is formed at a depth with respect to the adjacent upper portion of the silicon substrate 12, of about 200 Angstroms to about 500 Angstroms. For example, the total depth of adjacent source/drain extension (SDE) doped regions as shown below are preferably formed to be less than about 1600 Angstroms. Preferably, the lower portion of the subsequently formed SDE regions is about a factor of about 3 times to about 6 times the depth of the recessed area 12B.

Figure 1C:
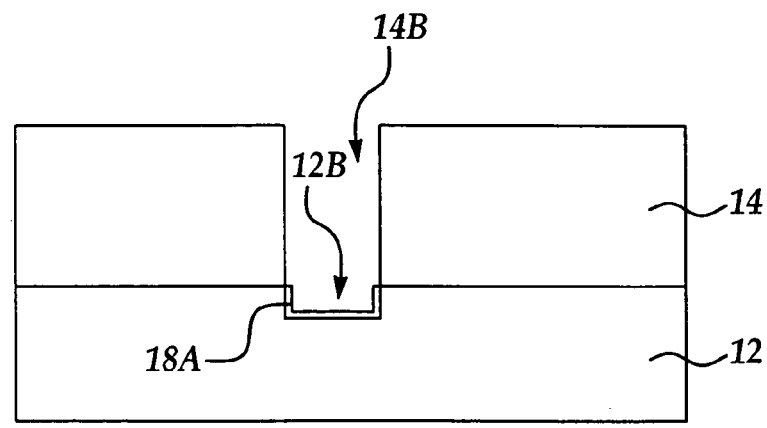

Referring to FIG. 1C, a conventional silicon oxide growth process is carried out, including wet or dry oxide growth methods, for example in an oxygen containing ambient at temperatures of from about 900° C. to about 1150° C. to grow an oxide layer e.g., 18A over the exposed areas (sidewalls and bottom portion) of the silicon substrate 12 within the recessed opening 12B. It will be appreciated that the thickness of the thermally grown oxide layer 18A may be adjustable depending on the depth of the recessed area, but is preferably less than about 50 Angstroms.

Figure 1D:
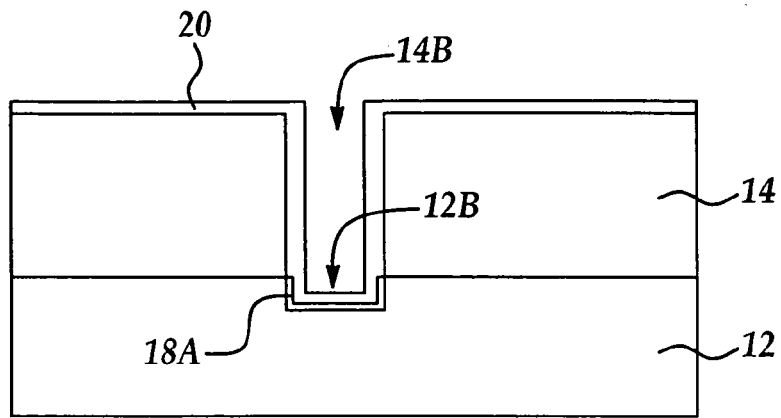

Referring to FIG. 1D, following the thermal oxide growth process to form oxide layer 18A, a conventional CVD process, for example LPCVD or PECVD is carried out to form a blanket deposited silicon nitride (e.g., $Si_3N_4$, SiN) layer e.g., 20 over the process surface, including over the sidewalls of opening 14B and sidewalls and bottom portion of recessed area 12B. It will be appreciated that the silicon nitride layer 20 may be formed over a range of thicknesses depending on the desired width of a subsequently formed notched (narrowed) portion at the bottom portion of the gate structure, including, for example from about 50 Angstroms to about 200 Angstroms.

Figure 1E:
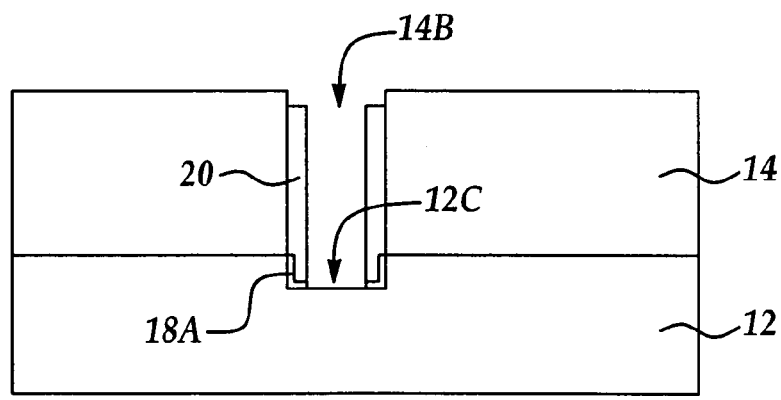

Referring to FIG. 1E, a conventional silicon nitride dry (plasma assisted) anisotropic etch process is carried out to first remove the silicon nitride layer 20 over a portion of the bottom portion of the recessed opening 12B to expose the underlying oxide layer portion 18A followed by either a conventional oxide dry etch and/or a conventional wet oxide stripping process, for example using dilute HF to remove a portion of the oxide layer 18A over a portion of the bottom portion within the recessed area 12B. For example, preferably an exposed silicon substrate 12 portion e.g., 12C is formed having a smaller width compared to opening 14B being about equally spaced from the sidewalls by a portion of the remaining silicon nitride layer 20 and oxide layer 18A sidewall portions. It will be appreciated that portions of oxide layer 18A and silicon nitride layer 20 are left overlying the sidewalls of recessed opening 12B. It will also be appreciated that the portion of the silicon nitride layer 20 overlying the opening level 14B may be fully or partially removed in the anisotropic etch process, preferably left covering at least a portion of the sidewalls of opening 14B.

Figure 1F:
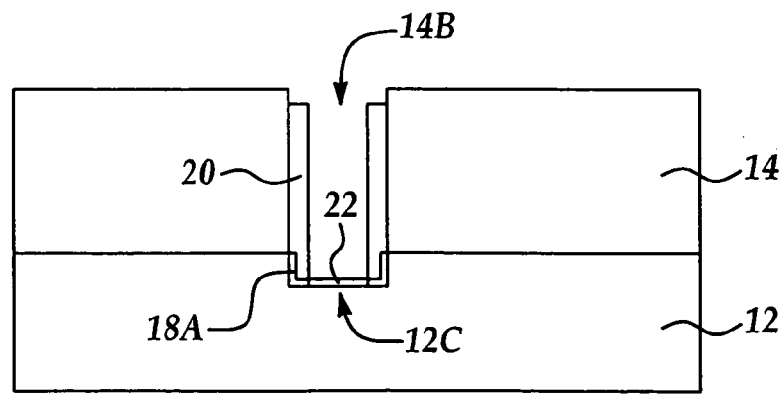

Referring to FIG. 1F, following an optional cleaning process, for example including conventional SC-1 and/or SC-2 cleaning solutions to clean the exposed surface of the silicon substrate 12, e.g., exposed portion 12C, a thermal oxide growth process is carried out, for example a wet or dry process, preferably a conventional dry oxide growth process in an oxygen containing ambient at a temperature of from about 900° C. to about 1150° C. to form a silicon dioxide ($SiO_2$) gate oxide layer 22 over exposed silicon portion 12C, preferably having a thickness of less than about 50 Angstroms.

Figure 1G:
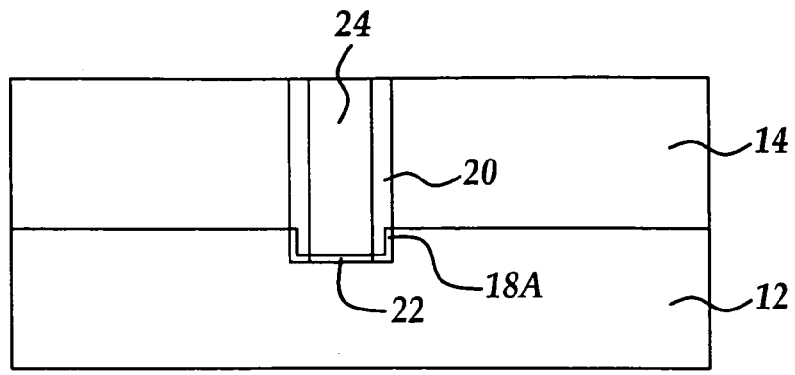

Referring to FIG. 1G, a conventional CVD polysilicon deposition process is then carried out, for example PECVD or HDP-CVD to blanket deposit a polysilicon layer 24 to fill the recessed opening areas 12B and opening 14B, followed by a planarization process, preferably CMP, to remove polysilicon layer portions overlying the opening 14B level and including remaining SiN portions, if any, to expose the oxide layer 14.

Figure 1H:
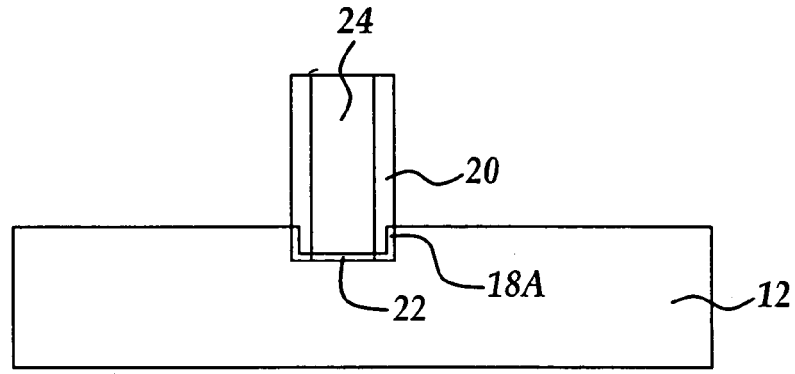

Referring to FIG. 1H, the oxide layer 14 is then selectively removed by a conventional oxide etching process, for example by using dilute HF in a wet etching process or a combination of dry and wet etching. Advantageously, the remaining SiN layer 20 sidewall portions act to protect the polysilicon layer 24 portion filling opening 14B during removal of the oxide layer 14 to form a polysilicon gate structure (gate electrode).

Figure 1I:
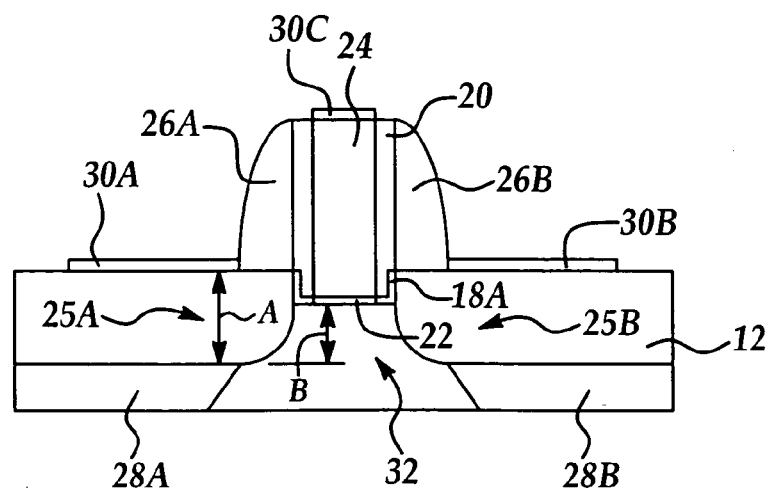

Referring to FIG. 1I, following formation of the polysilicon gate electrode, conventional S/D doping processes are carried out to form S/D doped regions within the silicon substrate 12 aligned with the polysilicon gate structure. For example, source drain extension (SDE) regions, e.g., 25A, 25B are formed by a first ion implant carried out by known methods including a thermal drive in process. It will be appreciated other methods such as plasma immersion doping may be used to form the SDE regions. Oxide and/or nitride sidewall spacers e.g., 26A, 26B, are then formed along the sidewalls of the polysilicon gate structure by conventional blanket deposition and dry or wet etchback processes. A second ion implant is then carried out by known methods to form more highly doped S/D regions e.g., partially shown as e.g., 28A, 28B aligned with the sidewall spacers 26A and 26B, followed by a thermal drive-in process. It will be appreciated that the profile and location of the doped regions e.g., SDE regions 25A, 25B and S/D region 28A, 28B are exemplary and may vary depending on the depth of the recessed portion of the polysilicon gate structure (e.g., recessed portion 12B) ion implantation ion and energy, and the thermal drive-in process.

Still referring to FIG. 1I, in one embodiment, preferably the depth (lower portion) of the SDE regions 25A, 25B is less than about 1600 Angstroms in vertical direction measured from the upper portion of silicon substrate 12, e.g., depth A, and preferably is less than about 1200 Angstroms, more preferably less than about 1000 Angstroms, measured from a level of the silicon substrate coplanar with a lower portion of the gate oxide layer 22, e.g., B.

Following the S/D doping process, optionally salicide portions e.g., 30A, 30B, and 30C, for example $TiSi_2$ or $CoSi_2$, are formed over the S/D regions and polysilicon electrode portion by conventional processes to complete formation of the MOSFET device.

Thus, a recessed gate structure and method for forming the same has been presented where the recessed gate structure advantageously achieves superior improvements in parasitic current leakage compared to a conventional raised source/drain structure. For example, by avoiding the necessity of a selective epitaxial growth (SEG) process for forming conventional raised S/D structures following formation of the S/D (e.g., SDE) doped regions, a thermal processing step (e.g., 600° C. is avoided thereby reducing lateral and vertical diffusion of the SDE regions. As a result the depth of the SDE regions are formed to have a shallower depths according to the present invention compared to prior art processes.

For example, subsequent elevated temperature processing steps causes increased vertical as well as lateral diffusion of the SDE region dopants, thereby degrading device performance, including increased short channel effects such as current leakage ($I_{off}$ leakage) while reducing $I_{drive}$. In addition, the reduced width of the gate oxide portion, e.g., 12C, reduces overlap capacitance including drain to gate overlap capacitance thereby improving both high frequency analog and digital device operation. The overlap capacitance is also advantageously reduced by reducing lateral dopant diffusion according to the structure and method of the present invention, for example, by reducing lateral dopant diffusion from the SDE regions 25A, 25B to the doped channel region e.g., 32.

Figure 2:
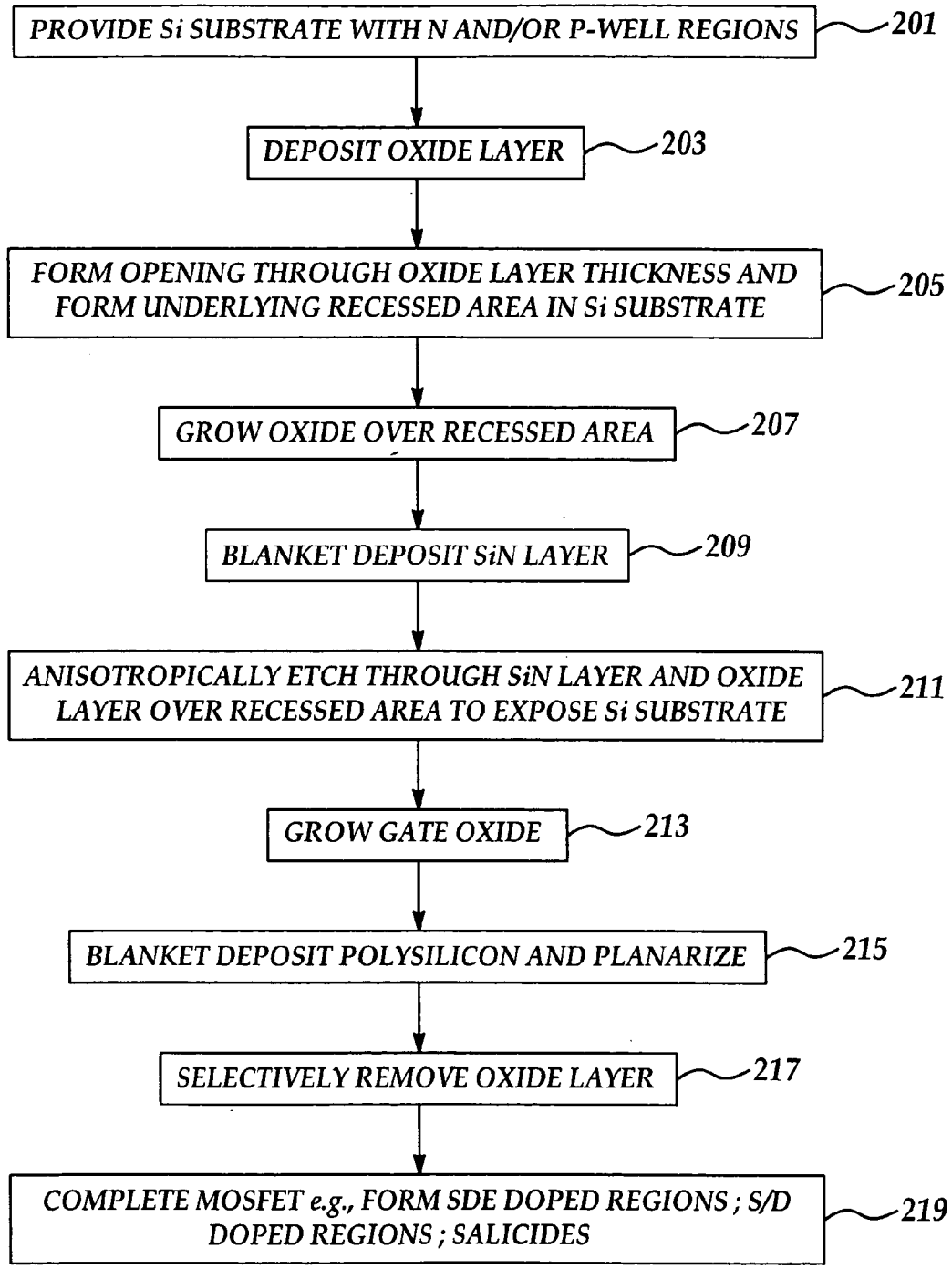
FIG. 2 is a process flow diagram including several embodiments of the present invention.

Referring to FIG. 2 is a process flow diagram including several embodiments of the present invention. In process 201, a silicon substrate is provided including active N and/or P-well doped regions. In process 203, a thick oxide layer is deposited according to preferred embodiments. In process 205 an opening is formed in through the thickness of the thick oxide layer including an underlying recessed area formed in the silicon substrate. In process 207, an oxide layer is thermally grown over the exposed silicon portion of the recessed area. In process 209, a silicon nitride layer is blanket deposited to line the opening. In process 211, the silicon nitride layer and thermally grown oxide layer over a bottom portion of the opening is removed (e.g., anisotropically etched) to expose a silicon substrate portion having a width smaller than the opening width. In process 213, a gate oxide is thermally grown over the exposed silicon portion. In process 215, the opening is backfilled with polysilicon followed by a planarization process to expose the thick oxide layer at the opening level. In process 217, the thick oxide layer is selectively removed to leave a polysilicon gate structure. In process 219, conventional processes are carried out to complete the MOSFET including forming S/D doping regions and optionally forming salicides over S/D regions.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a recessed gate structure with reduced current leakage and overlap capacitance comprising the steps of:

providing a silicon substrate layer;
forming a silicon oxide layer on the silicon substrate;
forming an opening in the silicon oxide layer to include a recessed area having about the same width as the opening extending into a thickness portion of the silicon substrate;
then lining the opening sidewalls and recessed area sidewalls with at least one dielectric liner followed by forming an exposed silicon substrate portion at a bottom portion of the recessed area having a width smaller than the opening;
then thermally growing a gate oxide over the exposed silicon substrate portion;
backfilling the opening with polysilicon;
planarizing the polysilicon to the opening level to reveal the silicon oxide layer; and,
selectively removing the silicon oxide layer to form a recessed gate structure.

2. The method of claim 1, wherein the step of lining the opening comprises:

thermally growing a first silicon oxide liner comprising the at least one dielectric liner to line the recessed area;
forming a silicon nitride layer comprising the at least one dielectric liner to include lining the opening and recessed area on the first silicon oxide liner; and,
etching the silicon nitride liner and the first silicon oxide liner at a bottom portion of the opening to form exposed silicon substrate portion than the opening.

3. The method of claim 1, wherein the recessed area is formed having a recessed depth of from about 200 Angstroms to about 400 Angstroms measured from the silicon substrate surface.

4. The method of claim 1, further comprising the step of forming a source/drain extension (SDE) doped regions adjacent either side of the recessed gate structure.

5. The method of claim 4, wherein the SDE doped regions are formed by one of an ion implant and a plasma immersion doping process.

6. The method of claim 4, wherein the depth of the SDE doped regions measured from the silicon substrate surface to a lowermost portion of the SDE doped region is less than about 1200 Angstroms.

7. The method of claim 6, wherein the depth of the recessed area is from about ⅓ to about ⅙ of the depth of the SDE doped regions.

8. The method of claim 1, wherein the gate oxide layer thickness is less than about 50 Angstroms.

9. The method of claim 2, wherein the first silicon oxide liner thickness is less than about 50 Angstroms.

10. The method of claim 2, wherein the silicon nitride liner thickness is between about 50 Angstroms and about 200 Angstroms.

11. The method of claim 2, wherein the step of etching comprises a dry anisotropic etching step for etching the silicon nitride liner.

12. The method of claim 2, wherein the step of etching comprises a wet etching process for etching the first silicon oxide liner.

13. The method of claim 1, further comprising the steps of forming sidewall spacers adjacent either side of the recessed gate structure and forming source/drain (S/D) doped regions.

14. The method of claim 13, further comprising the step of forming self aligned silicide (salicide) portions adjacent the sidewall spacers.

15. A method for forming a recessed gate structure having reduced current leakage and overlap capacitance comprising the steps of:

provide a silicon substrate layer;

forming a silicon oxide layer on the silicon substrate;

then forming an opening in the CVD silicon oxide layer to include a recessed area having about the same width as the opening extending into a thickness portion of the silicon substrate;

then growing a first silicon oxide liner to line the recessed area;

then forming a silicon nitride liner over the opening to include lining the opening and recessed area on the first silicon oxide layer;

then etching the silicon nitride liner and the first silicon oxide liner at a bottom portion of the opening to form an exposed silicon substrate portion having a width smaller than the opening;

then thermally growing a gate oxide over the exposed silicon substrate portion;

backfilling the opening with polysilicon;

planarizing the polysilicon to the opening level to reveal the silicon oxide layer; and, then selectively removing the silicon oxide layer to form a recessed gate structure.

16. A method for forming a recessed gate structure with reduced current leakage and overlap capacitance comprising the steps of:

providing a semiconductor substrate;

forming a first dielectric layer on the semiconductor substrate;

then forming an opening in the first dielectric layer extending into a thickness portion of the semiconductor substrate to form a recessed area having about the same width as the opening;

then lining the opening including the recessed area with at least a second dielectric liner;

then removing a portion of the at least a second dielectric liner at a bottom portion of the recessed area to expose the semiconductor substrate, said exposed bottom portion having a width smaller than the opening;

then forming a gate dielectric layer over said exposed bottom portion;

then backfilling the opening with a gate electrode material;

then planarizing the polysilicon to the opening level to reveal the first dielectric layer; and, then selectively removing the first dielectric layer to form a recessed gate structure.

17. The method of claim 16 wherein the first dielectric liner comprises silicon oxide grown to line the recessed area.

18. The method of claim 16 wherein the gate dielectric comprises silicon oxide grown on said bottom portion.

19. The method of claim 16 wherein the at least a second dielectric liner comprises a first liner of silicon oxide lining the recessed area and a second liner of silicon nitride lining the recessed area on the first liner and on the opening sidewalls.

20. The method of claim 16, wherein the recessed area is formed having a recessed depth of from about 200 Angstroms to about 400 Angstroms.

21. The method of claim 16, further comprising the step odf forming a source/drain extension (SDE) doped regions adjacent either side of the recessed gate structure.

22. The method of claim 20, wherein the SDE doped regions are formed by one of an ion implant and a plasma immersion doping process.

23. The method of claim 20, wherein the depth of the SDE doped regions measured from the silicon substrate surface to a lowermost portion of the SDE doped region is less than about 1200 Angstroms.

24. The method of claim 20, wherein the depth of the recessed area is from about 1/3 to about 1/6 of the depth of the SDE doped regions.

25. The method of claim 16, wherein the gate dielectric layer thickness is less than about 50 Angstroms.

26. The method of claim 16, wherein the gate electrode material comprises polysilicon.

* * * * *